United States Patent
Roberts

(10) Patent No.: US 9,484,113 B2
(45) Date of Patent: Nov. 1, 2016

(54) ERROR-CORRECTION CODING FOR HOT-SWAPPING SEMICONDUCTOR DEVICES

(71) Applicant: Advanced Micro Devices, Inc., Sunnyvale, CA (US)

(72) Inventor: David A. Roberts, Santa Cruz, CA (US)

(73) Assignee: ADVANCED MICRO DEVICES, INC., Sunnyvale, CA (US)

( * ) Notice: Subject to any disclaimer, the term of this patent is extended or adjusted under 35 U.S.C. 154(b) by 185 days.

(21) Appl. No.: 14/253,638

(22) Filed: Apr. 15, 2014

(65) Prior Publication Data

US 2015/0293812 A1 Oct. 15, 2015

(51) Int. Cl.
*G06F 11/00* (2006.01)
*G11C 29/04* (2006.01)
*G06F 11/10* (2006.01)
*G11C 11/16* (2006.01)

(52) U.S. Cl.
CPC ........... *G11C 29/04* (2013.01); *G06F 11/1048* (2013.01); *G11C 11/1673* (2013.01); *G11C 2029/0409* (2013.01); *G11C 2029/0411* (2013.01)

(58) Field of Classification Search
CPC ........... G06F 11/1044; G06F 11/1048; G06F 11/1068
USPC .................................................. 714/764, 768
See application file for complete search history.

(56) References Cited

U.S. PATENT DOCUMENTS

| | | | | |
|---|---|---|---|---|
| 5,448,578 A * | 9/1995 | Kim | ..................... | G06F 11/1076 711/103 |
| 7,155,568 B2 * | 12/2006 | Richard | ................ | G06F 3/0601 711/114 |
| 7,287,138 B2 * | 10/2007 | Bland | ................. | G06F 11/1666 711/162 |
| 7,487,428 B2 * | 2/2009 | Co | ....................... | G06F 11/1044 714/763 |
| 7,505,355 B2 * | 3/2009 | Kanda | ..................... | G11C 8/08 365/189.05 |
| 7,644,347 B2 * | 1/2010 | Alexander | .......... | G06F 11/1008 714/758 |
| 7,797,578 B2 * | 9/2010 | Co | .......................... | G11C 29/56 714/25 |
| 8,010,875 B2 * | 8/2011 | Gara | ................... | G06F 11/1012 714/773 |
| 2007/0255981 A1 * | 11/2007 | Eto | ..................... | G06F 11/1008 714/710 |
| 2009/0132876 A1 * | 5/2009 | Freking | ................. | G06F 11/106 714/723 |
| 2010/0020585 A1 * | 1/2010 | Rajan | ...................... | G11O 5/02 365/63 |

OTHER PUBLICATIONS

International Business Machines Corporation, "Enhancing IBM Netfinity Server Reliability: IBM Chipkill Memory", 1999, pp. 1-6, IBM Personal Computer Company.

(Continued)

*Primary Examiner* — Elmira Mehrmanesh
(74) *Attorney, Agent, or Firm* — Park, Vaughan, Fleming & Dowler LLP

(57) ABSTRACT

A memory read operation is directed at a group of semiconductor devices from which a first semiconductor device has been removed. An error in data for the memory read operation is detected based on error-correction coding (ECC). The error is caused at least in part by the first semiconductor device having been removed. ECC is used to determine corrected data for the memory read operation.

20 Claims, 6 Drawing Sheets

(56) References Cited

OTHER PUBLICATIONS

Xun Jian et al., "High Performance, Energy Efficient Chipkill Correct Memory with Multidimensional Parity", IEEE Computer Architecture Letters, 2012, pp. 1-4.

Xun Jian et al., "Adaptive Reliability Chipkill Correct (ARCC)", HPCA, 2013, pp. 1-12.

D.H. Yoon et al., "Virtualized and Flexible ECC for Main Memory", ASPLOS' 10, Mar. 13-17, 2010, pp. 1-12, Pittsburgh, Pennsylvania.

* cited by examiner

US 9,484,113 B2

ERROR-CORRECTION CODING FOR HOT-SWAPPING SEMICONDUCTOR DEVICES

STATEMENT OF GOVERNMENT INTEREST

This invention was made with Government support under Prime Contract Number DE-AC52-07NA27344, Subcontract Number B600716 awarded by DOE. The Government has certain rights in this invention.

TECHNICAL FIELD

The present embodiments relate generally to error correction in semiconductor devices, and more specifically to replacing semiconductor devices in a system.

BACKGROUND

Memory devices in electronic systems may wear out over time, such that failure levels associated with the memory devices may reach an unacceptable level. When the failure level of a particular memory device reaches an unacceptable level, it is desirable to replace the memory device. However, replacing the memory device may stop or interrupt program execution.

SUMMARY OF ONE OR MORE EMBODIMENTS

In some embodiments, a method of hot-swapping includes performing a memory read operation directed at a group of semiconductor devices from which a first semiconductor device has been removed. An error in data for the memory read operation is detected based on error-correction coding (ECC). The error is caused at least in part by the first semiconductor device having been removed. ECC is used to determine corrected data for the memory read operation.

In some embodiments, a system includes a group of memories to store code words. Each memory of the group of memories is situated in a respective semiconductor device of a group of semiconductor devices. The system also includes a plurality of buffers. Each buffer of the plurality of buffers electrically isolates a respective semiconductor device when the buffer is enabled, to allow the respective semiconductor device to be removed from the system. The system further includes an ECC module to detect and correct errors in code words read from the group of memories, including code words read from the group of memories after a buffer of the plurality of buffers has been enabled and before the respective semiconductor device corresponding to the buffer has been replaced.

In some embodiments, a non-transitory computer-readable storage medium stores one or more programs configured to be executed by a processor in a system that includes the processor, a group of semiconductor devices having respective memories, and an ECC module coupled to the group of semiconductor devices. The one or more programs include instructions to electrically isolate a specified semiconductor device of the group of semiconductor devices, to allow the specified semiconductor device to be removed. The one or more programs also include instructions to perform an operation referencing data stored in the respective memories of the group of semiconductor devices. The operation is to be performed after the specified semiconductor device has been electrically isolated to allow for its removal and before the specified semiconductor device has been replaced. The ECC coding module is to correct errors in the data.

These embodiments allow semiconductor devices that include memory to be removed and replaced without interrupting system operation.

BRIEF DESCRIPTION OF THE DRAWINGS

The present embodiments are illustrated by way of example and are not intended to be limited by the figures of the accompanying drawings.

Like reference numerals refer to corresponding parts throughout the figures and specification.

DETAILED DESCRIPTION

Reference will now be made in detail to various embodiments, examples of which are illustrated in the accompanying drawings. In the following detailed description, numerous specific details are set forth in order to provide a thorough understanding of the disclosure. However, some embodiments may be practiced without these specific details. In other instances, well-known methods, procedures, components, and circuits have not been described in detail so as not to unnecessarily obscure aspects of the embodiments.

Figure 1A:
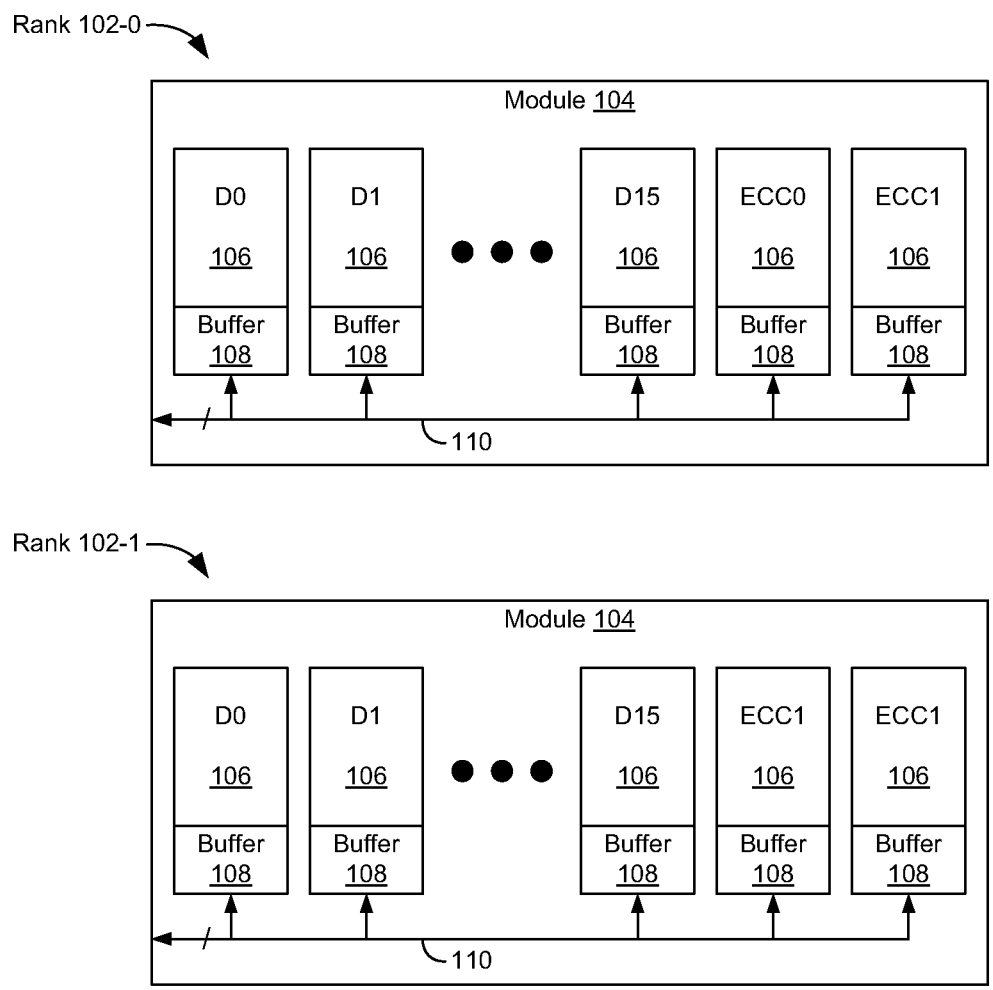
FIGS. 1A and 1B are block diagrams showing two ranks of semiconductor devices that each include memory in accordance with some embodiments.

FIG. 1A is a block diagram showing two ranks 102-0 and 102-1 of semiconductor devices 106 in accordance with some embodiments. Each of the semiconductor devices 106 includes memory. For example, each of the semiconductor devices 106 may be a memory device. Examples of such memory devices include, but are not limited to, dynamic random-access memory (DRAM), phase-change memory (PCM), resistive random-access memory (RRAM), and magnetoresistive random-access memory (MRAM). Alternatively, each of the semiconductor devices 106 includes embedded memory. Examples of such embedded memory include, but are not limited to, cache memories (e.g., implemented using static random-access memory (SRAM)), registers, and arrays of registers.

The semiconductor devices 106 in each of the ranks 102-0 and 102-1 may be mounted on a respective module 104 (e.g., dual in-line memory module (DIMM)) or other circuit board. For example, each of the semiconductor devices 106 may be situated in a respective socket (not shown) that couples the semiconductor device 106 to the module 104. Placing the semiconductor devices 106 in sockets, as opposed to directly soldering them to the modules 104, allows for easy removal and replacement of the semiconductor devices 106.

Each of the semiconductor devices 106 includes or is coupled to a buffer 108 that, when enabled, electrically isolates the semiconductor device 106 from the module 104 on which it is mounted. Each buffer 108, which is implemented for example using tri-state logic or relays, thus may be internal or external to its corresponding semiconductor device 106. When a buffer 106 is enabled (e.g., when its relays are opened), the corresponding semiconductor device 106 is de-coupled from signal lines on the module 104 and may also be decoupled from power supplies. When a buffer 106 is disabled (e.g., when its relays are closed), the corresponding semiconductor device 106 is coupled to signal lines on the module 104 and to power supplies. Examples of signal lines on the modules 104 to which the semiconductor devices 106 may be selectively coupled through the buffers 108 include, but are not limited to, a data bus 110, a command-and-address (C/A) bus, a clock signal line, and one or more signal lines to provide various enable signals. The buffers 108 allow for hot-swapping of the semiconductor devices 106: after a buffer 108 has been enabled, the corresponding semiconductor device 106 may be removed and replaced with a new semiconductor device 106 while the module 104 is powered up (e.g., while the module 104 is operating), without damaging either the semiconductor device 106 being removed or the new semiconductor device 106 being installed. Once the new semiconductor device 106 has been installed (e.g., in its socket), its buffer 108 may be disabled, thereby electrically coupling the new semiconductor device 106 with the module 104.

Each of the ranks 102-0 and 102-1 stores code words that have been encoded using error-correction coding (ECC). In some embodiments, the ECC uses a burst error-correcting code (e.g., a Reed-Solomon code), for which the code words are divided into symbols. Each semiconductor device 106 on a respective module 104, and thus in a respective rank 102-0 or 102-1, stores a distinct symbol of a code word. The symbols include data symbols, which are made up of data bits, and check symbols, which are made up of check bits used for ECC. In the example of FIG. 1A, each rank includes a first set of 16 semiconductor devices 106 that store respective data symbols D0 through D15 and a second set of two semiconductor devices 106 that store respective check symbols ECC0 and ECC1. Each symbol may include a plurality of bits; in one example, each symbol includes four bits, such that each code word includes 64 data bits and 8 check bits. (Each of the semiconductor devices 106 thus has a 4-bit data width in this example.) The check bits, and thus the check symbols, are sufficient to allow correct data to be recovered assuming an error on any number of bits of a single symbol in the code word (e.g., assuming a single symbol is lost). Since removal of one of the semiconductor devices 106 from a module 104 will cause an entire symbol associated with the removed semiconductor device 106 to be lost for each code word, the ECC scheme of FIG. 1A allows each module 104 to continue to operate when a semiconductor device 106 has been removed (e.g., is being replaced), assuming no errors occur for the symbols stored in the other semiconductor devices 106 on the module 104. Accordingly, the ECC scheme of FIG. 1A permits hot-swapping of a semiconductor device 106 without pausing operation.

Each of the semiconductor devices 106 on a respective module 104, and thus in a respective rank 102-0 or 102-1, couples to a distinct set of signal lines in a data bus 110. The symbols for a given code word are written to and read from the semiconductor devices 106 on a respective module 104 in parallel, using the data bus 110.

In some embodiments, code words written to a rank 102-0 or 102-1 are initially encoded using a first ECC scheme sufficient to allow correct data to be recovered assuming that a single symbol in the code word is lost, as described above.

Before hot-swapping is performed to replace a first semiconductor device 106, however, the code words may be re-encoded using a second ECC scheme to provide additional error protection. This additional error protection allows correct data to be recovered in the event of an error in a symbol from another semiconductor device 106 while the first semiconductor device 106 is being replaced. The second ECC scheme thus is more robust than the first ECC scheme. Re-encoding increases the number of check symbols in the code words, and therefore the data width of the code words. In some embodiments, the number of additional check symbols divided by two equals the number of additional symbols for which the loss of data (or check bits) can be tolerated. In some embodiments, the additional check symbols may be stored in available memory outside of the rank 102-0 or 102-1.

Figure 1B:
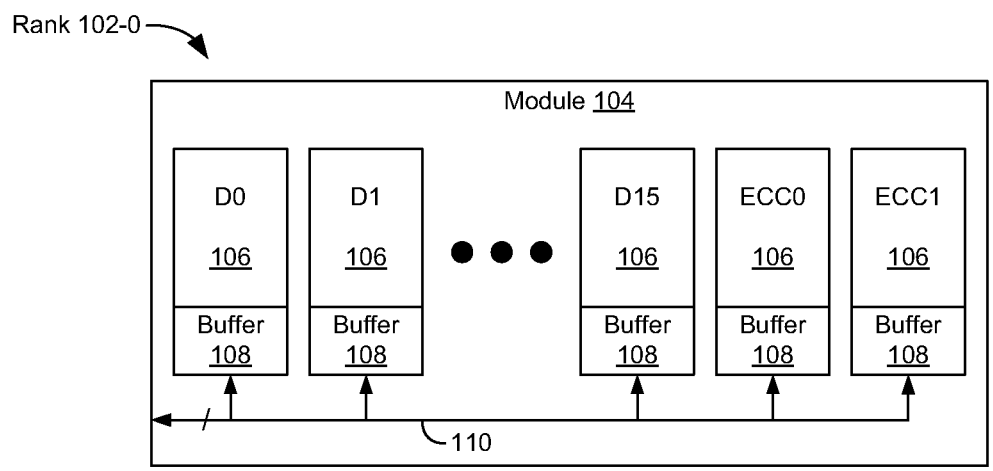
Figure 1B:
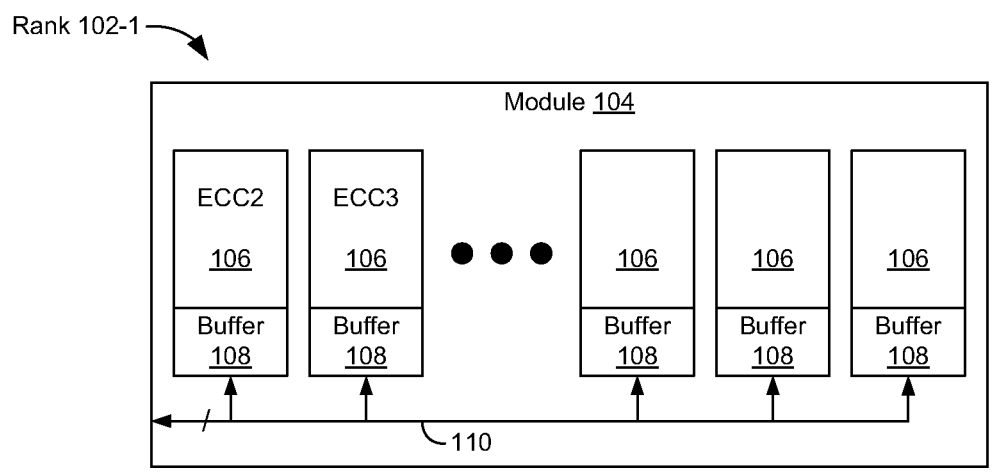

FIG. 1B is a block diagram showing an example in which code words stored in the rank 102-0 have been re-encoded to include two additional check symbols ECC2 and ECC3, in accordance with some embodiments. The two additional check symbols ECC2 and ECC3 are stored in two of the semiconductor devices 106 in the rank 102-1. The ECC scheme of FIG. 1B thus uses four check symbols ECC0 through ECC3 per code word. This ECC scheme can accommodate the loss of two symbols per code word. Therefore, this ECC scheme allows for proper functioning if an error occurs in a symbol for a second semiconductor device 106 in the rank 102-0 (or in one of the symbols ECC2 and ECC3 stored in the rank 102-1) at a time when a first semiconductor device 106 has been removed from the rank 102-0. Once the first semiconductor device 106 has been replaced with another semiconductor device 106, the ECC scheme for the rank 102-0 may revert to a scheme with two check symbols per code word, with the code words being re-encoded accordingly, and the rank 102-1 is freed up for other use. In other examples, re-encoding may be performed using more than two additional check symbols, to allow for a greater number of corrected errors and failed chips.

In some embodiments, instead of re-encoding data with a more robust ECC scheme in anticipation of hot-swapping, the same ECC scheme is continuously used for data stored in the ranks 102-0 and 102-1. For example, a single ECC scheme is continuously used that accommodates the loss of a single symbol per code word. Alternatively, a single ECC scheme is continuously used that accommodates the loss of up to a specified number of symbols (e.g., two symbols) per code word.

The ranks 102-0 and 102-1 are merely examples of groups of semiconductor devices 106 that use ECC for continued operation during hot-swapping of a semiconductor device 106. Other examples are possible.

Figure 2:
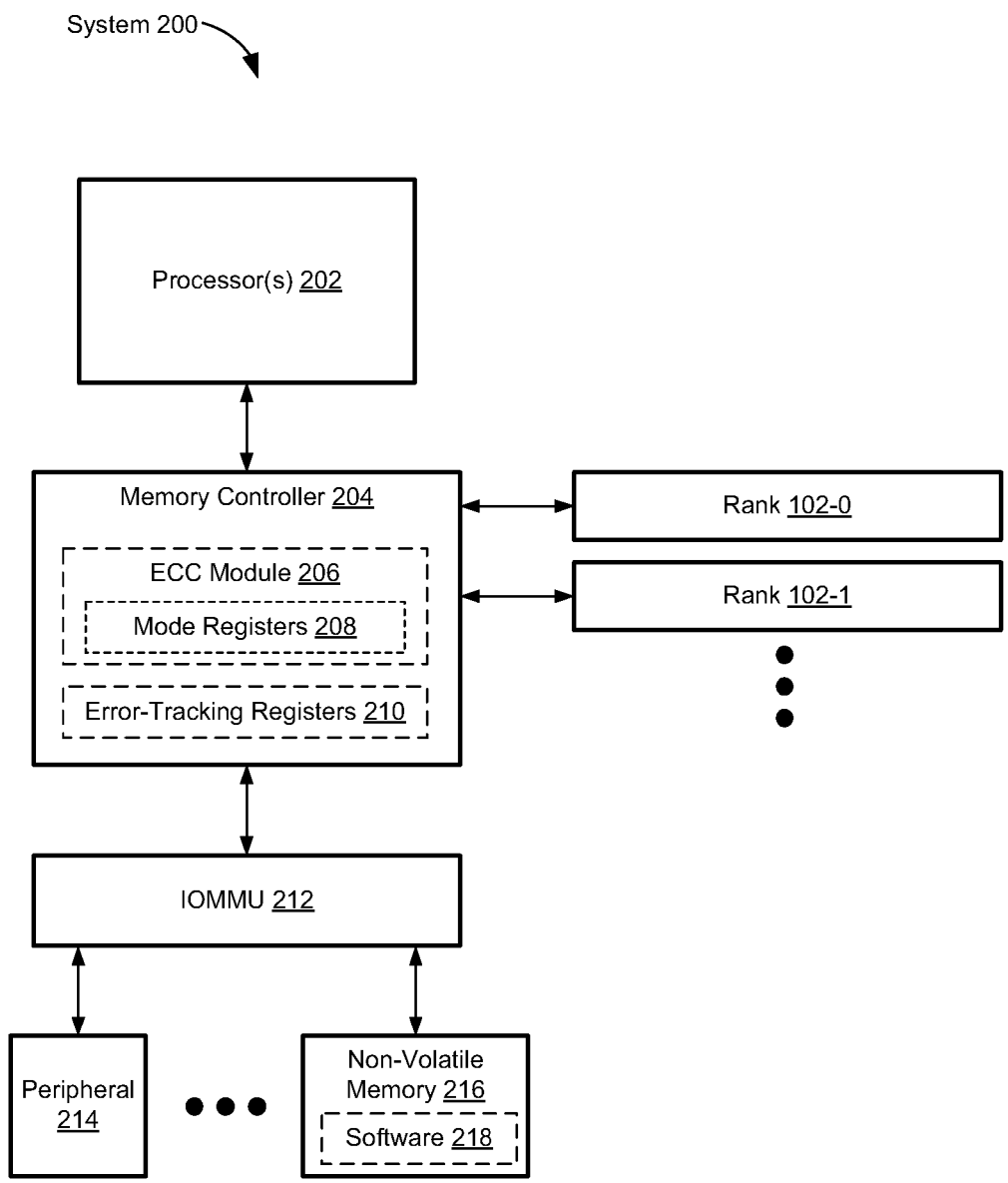
FIG. 2 is a block diagram of a system that includes the ranks of FIGS. 1A and/or 1B in accordance with some embodiments.

FIG. 2 is a block diagram of a system 200 that includes the ranks 102-0 and 102-1 in accordance with some embodiments. The system 200 also includes one or more processors 202. The one or more processors 202 may include one or more central processing units (CPUs) (e.g., each including one or more CPU cores), one or more graphics processing units (GPUs), and/or one or more other types of processors. A memory controller 204 couples the one or more processors 202 to the ranks 102-0 and 102-1 and to potential additional ranks of memory. (In the example of FIG. 2, the semiconductor devices 106 in the ranks 102-0 and 102-1 are memory devices in accordance with some embodiments.) An input/output memory management unit (IOMMU) 212 couples the memory controller 204, the one or more processors 202, and the ranks 102-0 and 102-1 to peripheral devices 214. One of the peripheral devices 214 may be a non-volatile memory 216 (e.g., a hard-disk drive, Flash-based solid-state drive, etc.), which includes a non-transitory computer-readable storage medium storing software 218. The software 218 includes one or more programs with instructions configured for execution by the one or more processors 202.

The memory controller 204 issues commands to the ranks 102-0 and 102-1 to perform memory access operations, including read and write operations. The memory access operations are performed in accordance with instructions executed by the one or more processors 202 and/or requests from peripherals 214. Memory access operations may be performed even if a semiconductor device 106 in a rank 102-0 or 102-1 has been removed and not yet replaced, or has been electrically isolated in preparation for removal.

The memory controller 204 includes an ECC module 206 that implements ECC for the ranks 102-0 and 102-1. For write commands, the ECC module 206 encodes data to be written to the ranks 102-0 and 102-1, thereby generating code words that the memory controller writes to the ranks 102-0 and 102-1. For read commands, the ECC module 206 detects and corrects errors in code words that the memory controller 204 reads from the ranks 102-0 and 102-1. The ECC module 206 performs this error detection and correction within the limits of the particular ECC scheme being used. The ECC module 206 thus extracts data from code words and corrects the data when possible. In some embodiments, the ECC module 206 uses a burst error-correcting code (e.g., a Reed-Solomon code), as described with respect to FIGS. 1A and/or 1B.

In some embodiments, when the ECC module 206 detects an error in a symbol read from a semiconductor device 106, it determines the correct value of the symbol and writes the correct value back to the semiconductor device 106. If the semiconductor device 106 has been removed, however, or has been electrically isolated in preparation for removal, then the ECC module 206 does not attempt to write back the correct value, since the attempt would fail. By suppressing writing back the correct value at times when a semiconductor device 106 has been removed or electrically isolated, the ECC module 206 saves power and memory bandwidth.

The ECC module 206 may determine whether or not to write back a corrected symbol to a semiconductor device 106 in a rank 102-0 or 102-1 based on a value stored in the mode registers 208. The mode registers 208 may include a respective bit for each semiconductor device 106 in the ranks 102-0 and 102-1. This bit is asserted (e.g., set to a first value, such as '1' or alternately '0') when the buffer 108 for a semiconductor device 106 is enabled, in preparation for hot-swapping, and is de-asserted (e.g., reset to a second value, such as '0' or alternately '1') once the semiconductor device 106 has been replaced and the corresponding buffer 108 disabled. The ECC module 206 will write back a corrected symbol to a semiconductor device 106 for a first mode in which the respective bit is de-asserted and will suppress writing back the corrected symbol to the semiconductor device 106 for a second mode in which the respective bit is asserted.

In some embodiments, the memory controller 204 includes error-tracking registers 210 that track error counts for semiconductor devices 106 in the ranks 102-0 and 102-1. For example, the error-tracking registers 210 may include a counter for each semiconductor device 106 in the ranks 102-0 and 102-1. When the ECC module 206 detects an error in a symbol received from a semiconductor device 106, the corresponding counter is incremented. A semiconductor device 106 may be selected for replacement if its error count satisfies (e.g., equals or exceeds) a threshold.

The software 218 may include instructions to track the error counts (e.g., by polling the error-tracking registers 210, or by maintaining the error counts in software), to determine whether an error count for a respective semiconductor device 106 satisfies the threshold, and/or to select the respective semiconductor device 106 for replacement based on a determination that its error count satisfies the threshold. The software 218 may also include instructions to electrically isolate the respective semiconductor device 106 (e.g., in response to the determination that its error count satisfies the threshold), for example by enabling the corresponding buffer 108, as well as instructions to disable the buffer 108 for a newly installed semiconductor device 106.

The software 218 may further include instructions to specify a first mode in which the ECC module 206 provides corrected data to a specified semiconductor device 106 in response to an error in data from the specified semiconductor device 106, and instructions to specify a second mode in which the ECC module 206 suppresses providing corrected data to the specified semiconductor device 106 once the specified semiconductor device 106 has been electrically isolated. The instructions to specify the second mode and the first mode may include, respectively, instructions to set and reset a bit for the specified semiconductor device 106 in the mode registers 208.

The software 218 may additionally include instructions to perform operations referencing data stored in the ranks 102-0 and 102-1, including operations to be performed after a semiconductor device 106 has been electrically isolated to allow for its removal from the rank 102-0 or 102-1 and before the semiconductor device 106 has been replaced (e.g., while the semiconductor device 106 is being replaced).

Figure 3:
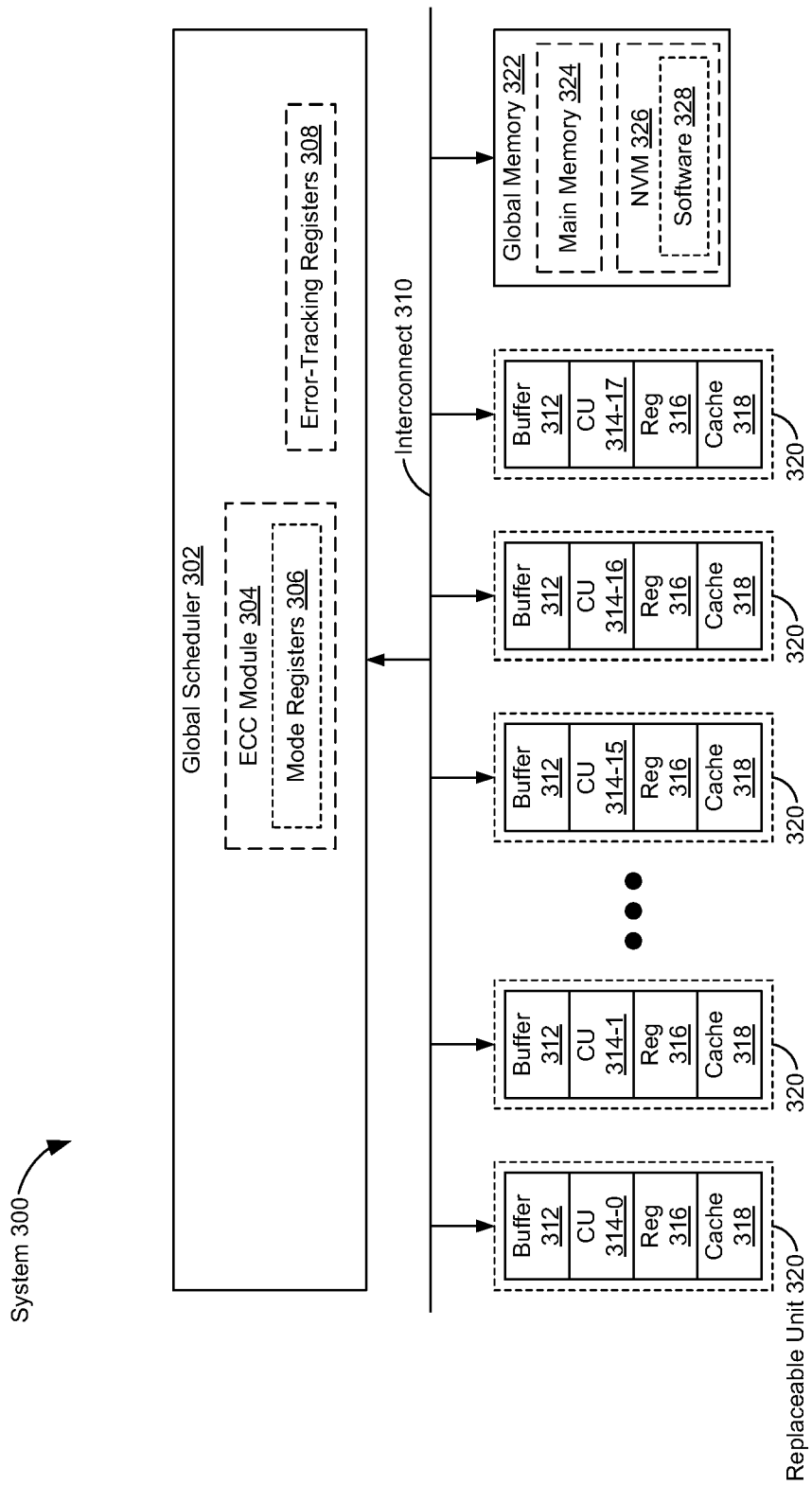
FIG. 3 is a block diagram of a system that includes a plurality of replaceable units with embedded memory, in accordance with some embodiments.

FIG. 3 is a block diagram of a system 300 that includes a plurality of replaceable units 320 with embedded memory, in accordance with some embodiments. The embedded memory includes registers 316 and/or cache memory 318. Alternatively, some of the replaceable units 320 may consist only of memory. The replaceable units 320 also include respective compute units 314-0 through 314-17. Each of the compute units 314-0 through 314-17 may be, for example, a processor core (e.g., a CPU core), a GPU, or another type of processor. Alternatively, some of the compute units 314-0 through 314-17 may be omitted (e.g., such that the corresponding replaceable units 320 are memory-only devices). For example, the compute units 314-16 and 314-17 may be omitted, such that the final two replaceable units 320 are memory devices that store check bits (e.g., check symbols) for data stored in embedded memory associated with the compute units 314-0 through 314-15 in the first 16 replaceable units 320. In some embodiments, such embodiments use a systematic code that leaves unmodified the data in the embedded memories associated with the compute units 314-0 through 314-15 and adds check bits that are stored in the last two replaceable units 320. Each of the replaceable units 320 includes or is coupled to a buffer 312 that, when enabled, electrically isolates the replaceable unit 320 from the rest of the system 300. The buffers 312 function like the buffers 108 (FIGS. 1A-1B).

In some embodiments, each of the replaceable units 320 is situated in a socket mounted on a circuit board. The use of sockets allows for easy removal and replacement of the replaceable units 320.

An interconnect 310 couples the replaceable units 320 to a global scheduler 302 and a global memory 322. The global scheduler 302 assigns tasks to respective replaceable units 320, thereby scheduling work performed in the system 300. The global memory 322 may include main memory 324 and non-volatile memory 326. The non-volatile memory 326 includes a non-transitory computer-readable storage medium storing software 328, which includes one or more programs with instructions configured for execution by the compute units 314-0 through 314-17.

The global scheduler 302 includes an ECC module 304 that functions by analogy to the ECC module 206 (FIG. 2). For example, the ECC module 304 implements a burst error-correcting code (e.g., a Reed-Solomon code). In this example, the replaceable units 320 store code words, with embedded memory in each replaceable unit 320 storing a respective symbol of each code word. The ECC module 304 generates the code words to be written to the replaceable units 320, and detects and corrects errors in code words read from the replaceable units 320. In one example, the replaceable units 320 include 16 units that store data symbols and two units that store check symbols. Such an ECC scheme allows correct data to be recovered when one of the replaceable units 320 has been removed or electrically isolated in preparation for removal (e.g., assuming no errors from other replaceable units 320). In some embodiments, code words may be re-encoded with a more robust ECC scheme before a replaceable unit 320 is removed (e.g., by analogy to the ECC scheme described with respect to FIG. 1B). Additional check symbols used for the more robust ECC scheme may be stored, for example, in the main memory 324.

The replaceable units 320 are thus an example of a group of semiconductor devices 106 that uses ECC for continued operation during hot-swapping of a semiconductor device 106 in the group.

The ECC module 304 may include mode registers 306, which function by analogy to the mode registers 208 (FIG. 2). When the ECC module 304 detects and corrects an error, it may write a corrected symbol back to a replaceable unit 320 or suppress writing a corrected symbol back to the replaceable unit 320, depending on whether a corresponding bit in the mode registers 208 is asserted.

The global scheduler 302 may include error-tracking registers 308, which function by analogy to the error-tracking registers 210 (FIG. 2). A replaceable unit 320 may be selected for replacement when its error count, as recorded in the error-tracking registers 210, satisfies a threshold.

The software 328 may include analogous instructions to the software 218 (FIG. 2).

Figure 4A:
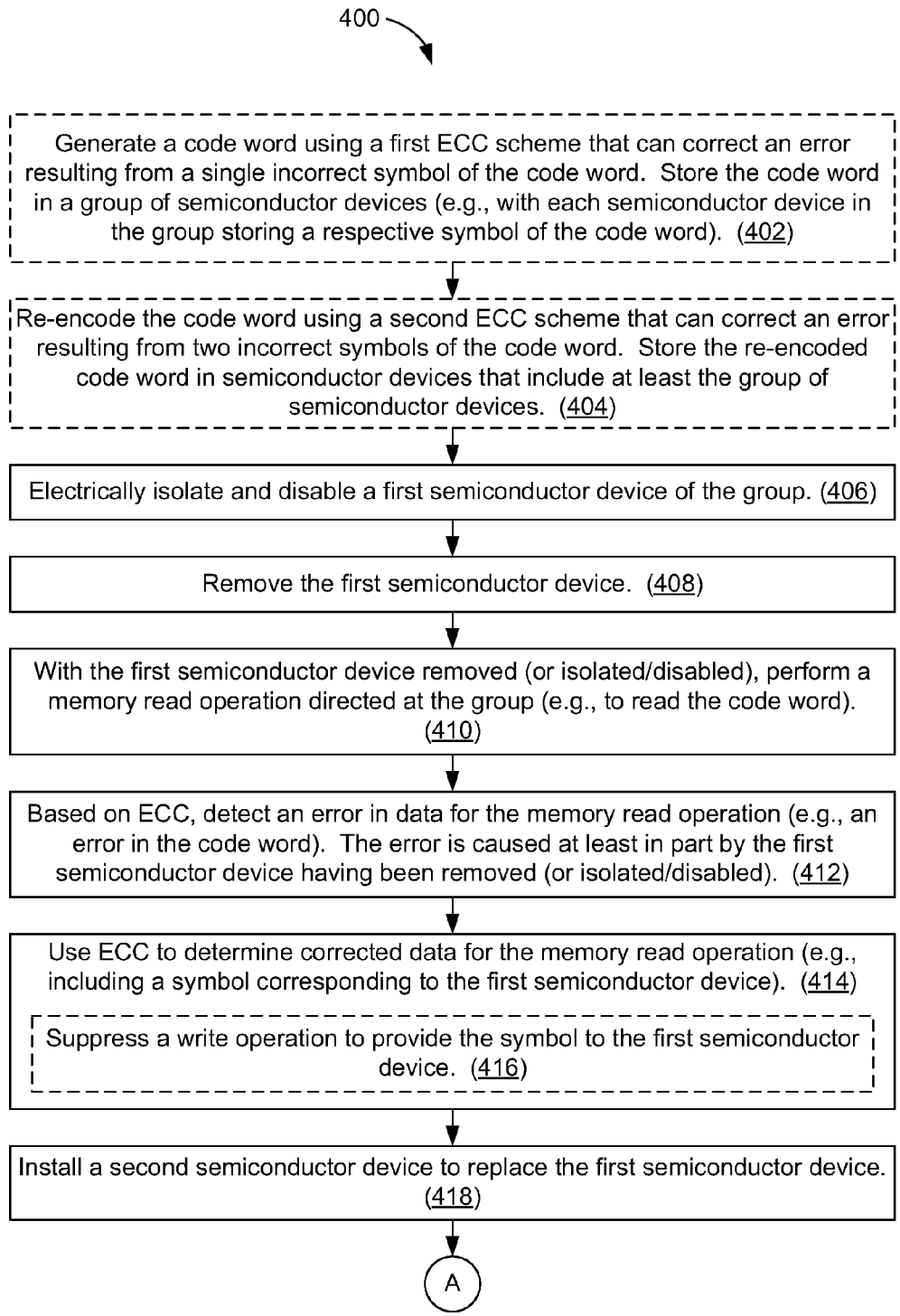
FIGS. 4A and 4B show a flowchart of a method of performing hot-swapping of a semiconductor device in accordance with some embodiments.
Figure 4B:
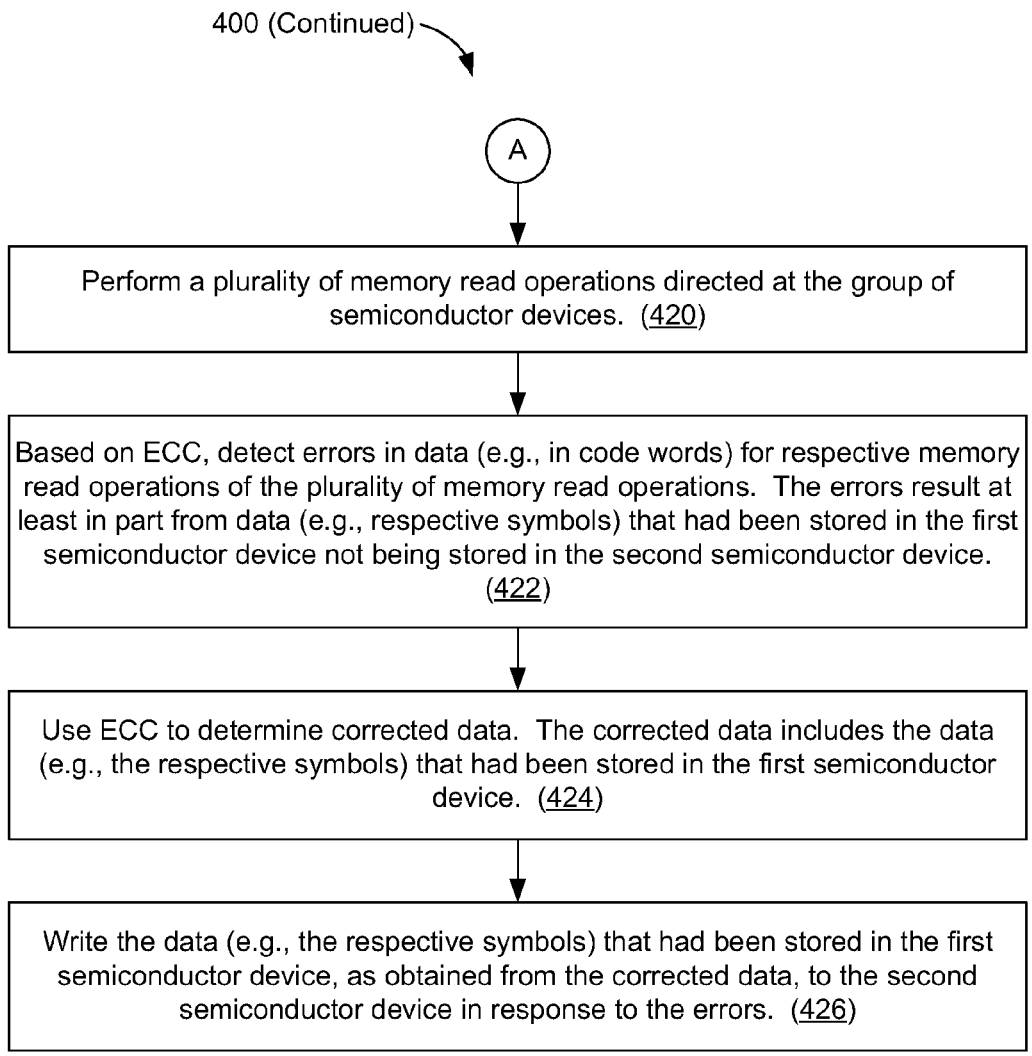

FIGS. 4A and 4B show a flowchart of a method 400 of performing hot-swapping of a semiconductor device 106 in accordance with some embodiments. The method 400 is performed, for example, in the system 200 (FIG. 2) or the system 300 (FIG. 3).

In some embodiments, a code word is generated (402) using a first ECC scheme that can correct an error resulting from a single incorrect symbol of the code word. For example, the first ECC scheme is a burst ECC scheme as described with respect to FIG. 1A. The code word is generated by applying the first ECC scheme to a data word. The code word is stored (402) in a group of semiconductor devices (e.g., with each semiconductor device in the group storing a respective symbol of the code word). For example, the code word is stored in a rank 102-0 or 102-1 of semiconductor devices 106 (FIGS. 1A and 2), or in a group of replaceable units 320 (FIG. 3).

In some embodiments, the group of semiconductor devices includes a first set of semiconductor devices and a second set of semiconductor devices. Each semiconductor device of the first set stores a respective data symbol of the code word (e.g., as shown for data symbols D0-D15 in FIG. 1A). Each semiconductor device of the second set stores a respective check symbol of the code word (e.g., as shown for check symbols ECC0 and ECC1 in FIG. 1A). Each of the data symbols and check symbols includes multiple bits (e.g., four bits).

The code word is optionally re-encoded (404) using a second ECC scheme (e.g., a burst ECC scheme as described with respect to FIG. 1B) that can correct an error resulting from multiple (e.g., two) incorrect symbols of the code word. In some embodiments, re-encoding the code word includes generating additional check symbols for the code word (e.g., check symbols ECC2 and ECC3, FIG. 1B).

The re-encoded code word is stored (404) in semiconductor devices that include at least the group of semiconductor devices. For example, respective symbols of the re-encoded code word are stored in the semiconductor devices 106 of the rank 102-0 and two semiconductor devices 106 of the rank 102-1 (FIG. 1B). In another example, respective symbols of the re-encoded code word may be stored in the replaceable units 320 and the main memory 324 (FIG. 3). The additional check symbols may be stored in one or more semiconductor devices outside of the group (e.g., in the two semiconductor devices 106 of the rank 102-1, FIG. 1B, or in the main memory 324, FIG. 3).

In some embodiments, the code word is initially generated using the second ECC scheme. In some embodiments, the code word is initially generated using the first ECC scheme and is not re-encoded.

A first semiconductor device of the group is electrically isolated and disabled (406). In some embodiments, the first semiconductor device includes or is coupled to a buffer circuit 108 (FIGS. 1A-1B) or 312 (FIG. 3), which is enabled to electrically isolate the first semiconductor device. In some embodiments, before the first semiconductor device is electrically isolated and disabled, a determination is made that a failure level satisfies a threshold. This determination is made, for example, based on an error count for the first semiconductor device as stored in an error-tracking register 210 (FIG. 2) or 308 (FIG. 3), or as stored in software. The first semiconductor device may be electrically isolated and disabled in response to this determination.

The first semiconductor device is removed (408) (e.g., from its socket).

With the first semiconductor device removed (or isolated and/or disabled in preparation for being removed), a memory read operation directed at the group is performed (410). For example, the memory read operation reads the code word.

Based on ECC, an error is detected (412) in data for the memory read operation (e.g., in the code word). The error is caused at least in part by the first semiconductor device having been removed (or electrically isolated). The error is detected, for example, by an ECC module 206 (FIG. 2) or 304 (FIG. 3).

ECC is used (414) to determine corrected data for the memory read operation. The corrected data are determined, for example, by the ECC module 206 (FIG. 2) or 304 (FIG. 3). In some embodiments, the corrected data include a symbol corresponding to the first semiconductor device.

In some embodiments, a write operation to provide the symbol to the first semiconductor device is suppressed (416) while the first semiconductor device is removed (or when the first semiconductor device has been electrically isolated and disabled in preparation for being removed). The decision to suppress the write operation may be based, for example, on assertion of a bit corresponding to the first semiconductor device in a mode register 208 (FIG. 2) or 306 (FIG. 3).

A second semiconductor device (e.g., a semiconductor device 106, FIGS. 1A-1B, such as a replaceable unit 320, FIG. 3) is installed (418) to replace the first semiconductor device.

In some embodiments, with the second semiconductor device installed, a plurality of memory read operations is performed (420, FIG. 4B) directed at the group of semiconductor devices. Based on ECC, errors in data (e.g., in code words) for respective memory read operations of the plurality of memory read operations are detected (422). The errors result at least in part from data (e.g., respective symbols) that had been stored in the first semiconductor device not being stored in the second semiconductor device. ECC is used (424) to determine corrected data. The corrected data include the data (e.g., the respective symbols) that had been stored in the first semiconductor device but are not stored in the second semiconductor device. The data (e.g., the respective symbols) that had been stored in the first semiconductor device, as obtained from the corrected data, are written (426) to the second semiconductor device in response to the errors. In this manner, data are stored to the second semiconductor device over time instead of in an initial batch of writes that might be performed when the second semiconductor device is first installed, thereby avoiding the performance penalty that would result from performing the initial batch of writes.

While the method 400 includes a number of operations that appear to occur in a specific order, it should be apparent that the method 400 can include more or fewer operations. Two or more operations may be combined into a single operation and performance of two or more operations may overlap.

In some embodiments, the software 218 (FIG. 2) and/or 328 (FIG. 3) includes one or more programs with instructions that, when executed, result in performance of all or a portion of the method 400.

The foregoing description, for purpose of explanation, has been described with reference to specific embodiments. However, the illustrative discussions above are not intended to be exhaustive or to limit all embodiments to the precise forms disclosed. Many modifications and variations are possible in view of the above teachings. The disclosed embodiments were chosen and described to best explain the underlying principles and their practical applications, to thereby enable others skilled in the art to best implement various embodiments with various modifications as are suited to the particular use contemplated.

What is claimed is:

1. A method of hot-swapping semiconductor devices for a memory module, the hot-swapping comprising removing a semiconductor device from the memory module and replacing the semiconductor device with another semiconductor device while the memory module is powered up, the method comprising:
    performing a memory read operation directed at a group of semiconductor devices mounted in respective sockets that couple the semiconductor devices to the memory module, wherein a first semiconductor device has been removed from the respective socket in which the first semiconductor device was mounted;
    based on error-correction coding (ECC), detecting an error in data for the memory read operation, the error being caused at least in part by the first semiconductor device having been removed; and
    using ECC to determine corrected data for the memory read operation.

2. The method of claim 1, wherein:
    the group of semiconductor devices comprises a first set of semiconductor devices and a second set of semiconductor devices;
    each semiconductor device of the first set stores a respective data symbol of the code word accessed in the memory read operation, each data symbol comprising a plurality of bits; and
    each semiconductor device of the second set stores a respective check symbol of the code word, each check symbol comprising a plurality of bits.

3. The method of claim 2, further comprising:
    generating the code word using a first ECC scheme that can correct an error resulting from a single incorrect symbol of the code word; and
    before removing the first semiconductor device, re-encoding the code word using a second ECC scheme that can correct an error resulting from two incorrect symbols of the code word.

4. The method of claim 3, wherein re-encoding the code word comprises:
    generating additional check symbols for the code word; and
    storing the additional check symbols in one or more semiconductor devices outside of the group.

5. The method of claim 1, wherein the corrected data comprise a symbol corresponding to the first semiconductor device, the method further comprising:
    in response to the first semiconductor device having been removed, suppressing a write operation to provide the symbol to the first semiconductor device.

6. The method of claim 1, further comprising, before removing the first semiconductor device, electrically isolating the first semiconductor device.

7. The method of claim 6, wherein:
    the first semiconductor device comprises a buffer circuit; and
    electrically isolating the first semiconductor device comprises enabling the buffer circuit.

8. The method of claim 6, wherein:
    the first semiconductor device is coupled to a buffer circuit; and
    electrically isolating the first semiconductor device comprises enabling the buffer circuit.

9. The method of claim 6, further comprising, before electrically isolating the first semiconductor device, determining that a failure level of the first semiconductor device satisfies a threshold;
    wherein electrically isolating the first semiconductor device is performed in response to the determining.

10. The method of claim 1, further comprising, after installing a second semiconductor device to replace the first semiconductor device:
    performing a plurality of memory read operations directed at the group of semiconductor devices;
    based on ECC, detecting errors in data for respective memory read operations of the plurality of memory read operations, the errors resulting at least in part from data that had been stored in the first semiconductor device not being stored in the second semiconductor device;
    using ECC to determine corrected data, the corrected data comprising the data that had been stored in the first semiconductor device; and writing the data that had been stored in the first semiconductor device to the second semiconductor device in response to the errors.

11. The method of claim 1, wherein:
the group of semiconductor devices comprises a rank of memory devices on the memory module; and
each memory device of the rank is mounted in a respective socket that couples the memory device to the module.

12. A system for hot-swapping semiconductor devices for a memory module, the hot-swapping comprising removing a semiconductor device from the memory module and replacing the semiconductor device with another semiconductor device while the memory module is powered up, comprising:
a group of memories to store code words, each memory of the group of memories being situated in a respective semiconductor device of a group of semiconductor devices that are mounted in respective sockets that couple the semiconductor devices to the memory module;
a plurality of buffers, wherein each buffer of the plurality of buffers is to electrically isolate a respective semiconductor device of the group of semiconductor devices when the buffer is enabled, to allow the respective semiconductor device to be removed from the respective socket in which the respective semiconductor device is mounted; and
an error-correction coding (ECC) module to detect and correct errors in code words read from the group of memories, including code words read from the group of memories after a buffer of the plurality of buffers has been enabled and the respective semiconductor device corresponding to the buffer removed, and before the respective semiconductor device corresponding to the buffer has been replaced.

13. The system of claim 12, wherein each buffer of the plurality of buffers is externally coupled to a respective semiconductor device of the group of semiconductor devices.

14. The system of claim 12, wherein each buffer of the plurality of buffers is situated in a respective semiconductor device of the group of semiconductor devices.

15. The system of claim 12, wherein the group of memories comprises:
a first set of memories in respective semiconductor devices of the group of semiconductor devices to store data symbols of code words, each data symbol comprising a plurality of bits; and
a second set of memories in respective semiconductor devices of the group of semiconductor devices to store check symbols of the code words for ECC, each check symbol comprising a plurality of bits.

16. The system of claim 15, wherein the ECC module is to:
generate the code words using a first ECC scheme that can correct an error resulting from a single incorrect symbol of a code word; and
re-encode the code words using a second ECC scheme before a buffer of the plurality of buffers is enabled, wherein the second ECC scheme can correct an error resulting from two incorrect symbols of a code word.

17. The system of claim 15, wherein:
code words that use the second ECC scheme include additional check symbols as compared to code words that use the first ECC scheme; and
the system further comprises one or more memories to store the additional check symbols, the one or more memories being distinct from the group of memories.

18. The system of claim 12, wherein, in response to incorrect data from a respective memory of the group of memories, the ECC module is to provide corrected data to the respective memory when the buffer corresponding to the respective memory is not enabled and to suppress providing corrected data to the respective memory once the buffer corresponding to the respective memory has been enabled and before the respective memory has been replaced.

19. A non-transitory computer-readable storage medium storing one or more programs configured to be executed by a processor in a system comprising the processor, a group of semiconductor devices comprising respective memories mounted in respective sockets that couple the semiconductor devices to a memory module, and an error-correction coding (ECC) module coupled to the group of semiconductor devices, wherein the one or more programs enable hot-swapping the semiconductor devices, the hot-swapping comprising removing a semiconductor device from the memory module and replacing the semiconductor device with another semiconductor device while the memory module is powered up, the one or more programs comprising:
instructions to electrically isolate a specified semiconductor device of the group of semiconductor devices, to allow the specified semiconductor device to be removed from the respective socket; and
instructions to perform an operation referencing data stored in the respective memories of the group of semiconductor devices, the operation to be performed after the specified semiconductor device has been electrically isolated and removed from the respective socket, and before the specified semiconductor device has been replaced;
wherein the ECC coding module is to correct errors in the data.

20. The computer-readable storage medium of claim 19, wherein the one or more programs further comprise:
instructions to specify a first mode in which the ECC module provides corrected data to the specified semiconductor device in response to an error in data from the specified semiconductor device; and
instructions to specify a second mode in which the ECC module suppresses providing corrected data to the specified semiconductor device once the specified semiconductor device has been electrically isolated and before the specified semiconductor device has been replaced.

* * * * *